United States Patent [19]
Coln et al.

[11] Patent Number: 5,686,913
[45] Date of Patent: Nov. 11, 1997

[54] SERIAL DATA INTERFACE APPARATUS AND METHOD FOR DETECTING AN INPUT WORD LENGTH AND SELECTING AN OPERATING MODE ACCORDINGLY

[75] Inventors: Michael C. W. Coln, Lexington, Mass.; John M. Wynne, Limerick, Ireland

[73] Assignee: Analog Devices, Inc., Norwood, Mass.

[21] Appl. No.: 540,008

[22] Filed: Oct. 6, 1995

[51] Int. Cl.$^6$ .................................................. H03M 1/00
[52] U.S. Cl. .......................... 341/51; 341/63; 341/173; 341/142
[58] Field of Search ................. 341/50, 51, 63, 341/90, 173, 176, 142

[56] References Cited

U.S. PATENT DOCUMENTS

| | | | |
|---|---|---|---|
| 4,829,462 | 5/1989 | Freeman et al. | 364/715.11 |
| 5,083,288 | 1/1992 | Somlyody et al. | 364/550 |

FOREIGN PATENT DOCUMENTS 26 06 558 A1  1/1977  Germany.

OTHER PUBLICATIONS

Measurement Technology in Practice, 1207a Journal A, 32 (1991) Oct., No. 3, Antwerp, BE, "The digitisation of field instruments", Willem Van Der Bijl, pp. 62–65.

Abstract, Publication No. JP4167818, Publication Date 15 Jun. 1992, "Digital/Analog Converter" Nomura Nobuo, vol. 16, No. 469.
Abstract, Publication No. JP5252039, Publication Date 28 Sep. 1993, "Multi–Channel D/A Converter of 3–Line Serial Data Transfer System", Ishikawa Hitoshi, vol: 18, No. 10.
International Search Report of International Application No. PCT/US 96/15407.
Edited by Daniel H. Sheingold, Transducer Interfacing Handbook, 1981, pp. 93–95.
Analog Devices, Inc., Design–in Reference Manual, 1994, pp. 3–15 to 3–23.

*Primary Examiner*—Jeffrey A. Gaffin
*Assistant Examiner*—Jason H. Vick
*Attorney, Agent, or Firm*—Wolf, Greenfield & Sacks, P.C.

[57] ABSTRACT

An apparatus and a method for controlling a mode of operation of a data converter is based on a length of an input word signal to the data converter. The apparatus includes a bit counter that counts the number of bits in the word received by the data converter and provides a word length signal corresponding to the number of bits in the word, and a mode selector that receives the word length signal and selects an operational mode of the data converter based on the word length signal. The method includes steps of counting the number of bits in the word, and selecting a mode of operation of the data converter based on the number of bits in the word.

19 Claims, 7 Drawing Sheets

SERIAL DATA INTERFACE APPARATUS AND METHOD FOR DETECTING AN INPUT WORD LENGTH AND SELECTING AN OPERATING MODE ACCORDINGLY

BACKGROUND OF THE INVENTION

1. Field of the Invention

The present invention relates generally to data transmission, and more particularly, to a method and apparatus for detecting an input word length and selecting an operating mode of the apparatus accordingly.

2. Discussion of the Related Art

In many industrial process-control applications, processes are monitored and controlled using current control loops having a span of 16 milliamps full-scale, and an offset of 4 milliamps and a resulting output range of 4 to 20 milliamps. Examples of industrial process-control applications that utilize current control loops to monitor and control process variables include oil refineries, industrial food processing plants, manufacturing facilities, and a variety of other industrial applications.

FIG. 1 shows a typical 4 to 20 milliamp process control loop 10. The process control loop 10 consists of a transducer 12, a loop supply 14 and a controller 16. As shown in FIG. 1, three interconnecting leads, 18, 19 and 20, forming a current control loop 22, operatively interconnect the controller, the transducer, and the loop supply. In the process control system 10, the controller typically sends information in the form of electrical current via lead 18 of the current loop 22 to control parameters of the transducer. Alternatively, the transducer may be a sensor, that includes a transmitter, that transmits sensor data to the controller via lead 18 of the current loop 22 to allow the controller to monitor parameters measured by the sensor. The loop supply 14 is used to provide power to the transducer. In the 4 to 20 milliamp control loop of FIG. 1, a current range of 4 to 20 milliamps is used for information transfer, and the offset of 0 to 4 milliamps is available to power the transducer 12.

In an industrial application, the transducer 12 may be a control valve used to regulate pressure and temperature of a food processing system. The controller in such an application, based on inputs from temperature and pressure sensors (not shown), may send signals to the control valve to control settings of the control valve to maintain predetermined temperatures and pressures in the food processing system. In another industrial application, the transducer 12 may be a moisture sensor in an oil refining process. In this application, the moisture sensor (referred to in some applications as a process variable "transmitter") may receive power from the loop supply and transmit sensor data to a central computer controller.

As shown in FIG. 2 a second transducer 24 may be connected to the current loop 22. In the oil refining process application described above, the second transducer 24 may be a meter that displays a moisture reading of the moisture sensor, or the second transducer may be a chart recorder that records moisture levels over time.

In prior art systems, the controller 16 and the loop supply 14 may be incorporated in one device that also provides other data processing functions such as digital-to-analog conversion. An example of such a device is the AD420 manufactured by Analog Devices Inc., Norwood, Mass.

FIG. 3 shows an industrial process control system 30. The industrial process control system 30 includes a transmitter element 31, a controller 72, and interconnecting leads 32 and 34 that comprise a 4 to 20 milliamp control loop 36. The transmitter element 31 is similar to the transducer 12 of FIG. 1. However, the transmitter element includes additional processing capability The transmitter element 31 includes a microprocessor 50 coupled to a data converter 40 by three interconnecting buses 48A, 48B, and 48C, and a signal conditioner and analog-to-digital converter 60 coupled to the microprocessor 50 by interconnecting buses 52 and 54. The signal conditioner and analog-to-digital converter 60 also is coupled to two sensors 62 and 64.

The operation of the industrial process control system 30 shown in FIG. 3 will now be described with reference to an industrial application in which the sensors 62 and 64 respectively monitor temperature and pressure in a food processing chamber of a food processing system. Temperature and pressure readings detected by the sensors 62 and 64 are received by the signal conditioner and analog-to-digital converter 60 and converted to digital signals for transmission to the microprocessor 50 over interconnecting buses 52 and 54. The microprocessor processes the received signals and determines an appropriate setting of a control valve (not shown) based on the received signals. The microprocessor then sends digital signals representing the appropriate setting for the control valve to the data converter 40 over interconnecting buses 48A, 48B, and 48C. Serial digital data is transferred over interface bus 48C, a data clock signal is transferred over interface bus 48B, and a data latch control signal is transferred over interface bus 48A.

The serial data interface unit 42 of the data converter 40 receives the serial digital data from the microprocessor, converts the digital data from serial format to parallel format and provides the converted data to the digital-to-analog converter 44. The digital-to-analog converter converts the digital data to analog data and provides the analog data to the loop interface unit 46. The loop interface unit then transmits analog data, in the form of a current within the 4 to 20 milliamp range, over the current control loop 36 to the controller 72. The controller 72 may be part of a central control system, located remote from the transducer element 31, that generates a signal to control the control valve. The control valve may be coupled to the controller using a second current control loop (not shown).

In many applications of process control systems that use current control loops, it is desirable to provide galvanic isolation between the current control loop and other components of the process control system to prevent ground loop coupling and other forms of electromagnetic interference (which degrade current loop system performance accuracy) from being induced into the process control system by the current control loop. The galvanic isolation may be achieved, for example, by connecting optoisolators or transformers to interconnecting leads between components of the process control system. Power supplies to isolated components also may employ transformers on power leads to provide galvanic isolation. In some conventional current loop applications, the galvanic isolation is provided at each of the interface buses 48A, 48B, and 48C between the microprocessor 50 and the data converter 40.

In certain process control system applications, it also is desirable to enable the microprocessor 50 to indicate to the controller 72 that an alarm condition is present. In providing this capability it is desirable to maintain the galvanic isolation between the current control loop and other components of the control system to ensure reliable system performance accuracy.

SUMMARY OF THE INVENTION

According to one embodiment of the present invention, a data converter for receiving serial data having a number of bits in a word is provided. The data converter comprises a bit counter that counts the number of bits in a word received by the data converter and provides a word length signal corresponding to the number of bits in the word, and a mode selector that receives the word length signal and selects an operational mode of the data converter based on the word length signal.

According to another aspect of the present invention, a method is provided for selecting a mode of operation of a data converter that receives serial data having a number of bits in a word. The method includes steps of counting the number of bits in the word, and selecting a mode of operation of the data converter based on the number of bits in the word.

According to another aspect of the present invention, a method of selecting a mode of operation of a data converter using a data transmitter is provided. The data transmitter transmits serial data having a number of bits in a word to the data converter. The method includes steps of determining a mode of operation of the data converter, setting the number of bits in the word to a first number for a first mode of operation of the data converter, and setting the number of bits in the word to a second number for a second mode of operation of the data converter.

In another embodiment of the present invention, a microprocessor is provided for processing received data and transmitting serial data to a data converter. The microprocessor comprises a processing unit that processes the received data, and means for setting a number of bits of a word of the serial data to a first number for a first mode of operation of the data converter and to a second number for a second mode of operation of the data converter.

In yet another embodiment of the present invention, a process control module is provided for receiving an input signal and providing an output signal to control a process in response to the input signal. The process control module comprises a microprocessor that receives and processes the input signal and provides a serial signal having a number of bits in a word, and a data converter that receives the serial signal. The data converter includes a bit counter that counts the number of bits in the word received by the data converter and provides a word length signal corresponding to the number of bits in the word, and a mode selector that receives the word length signal and selects an operational mode of the data converter based on the word length signal.

DESCRIPTION OF THE FIGURES

For a better understanding of the present invention, reference is made to the drawings which are incorporated herein by reference and in which.

DETAILED DESCRIPTION

Figure 1:
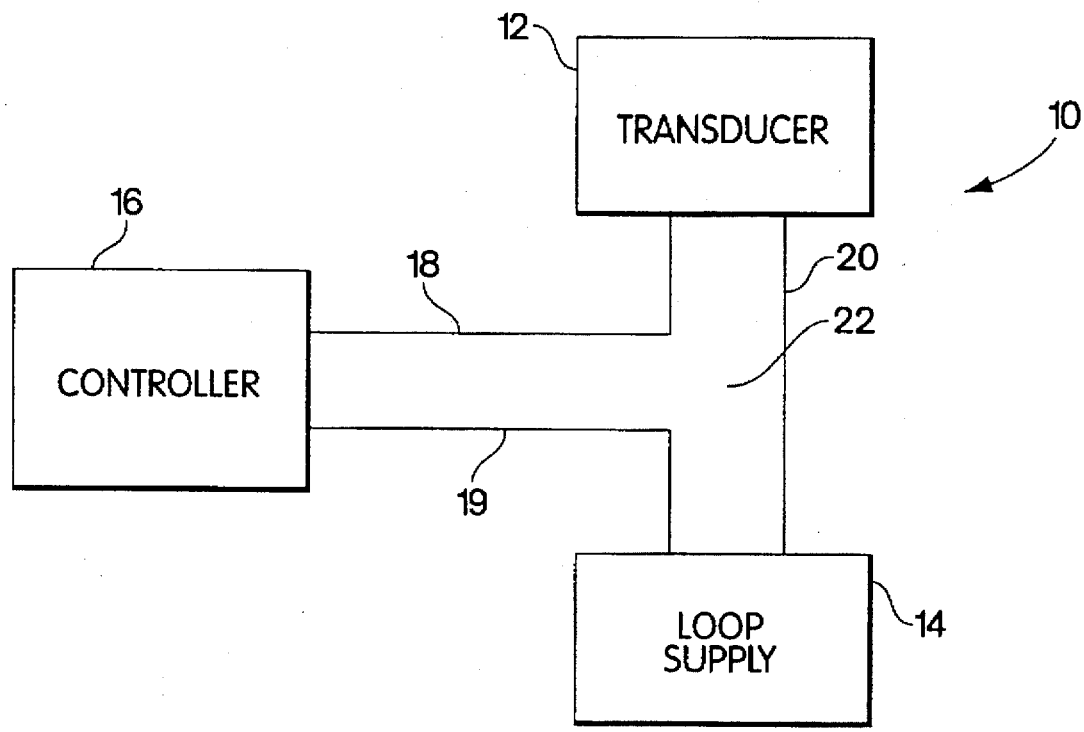
FIG. 1 is a block diagram of a conventional current control loop system.
Figure 2:
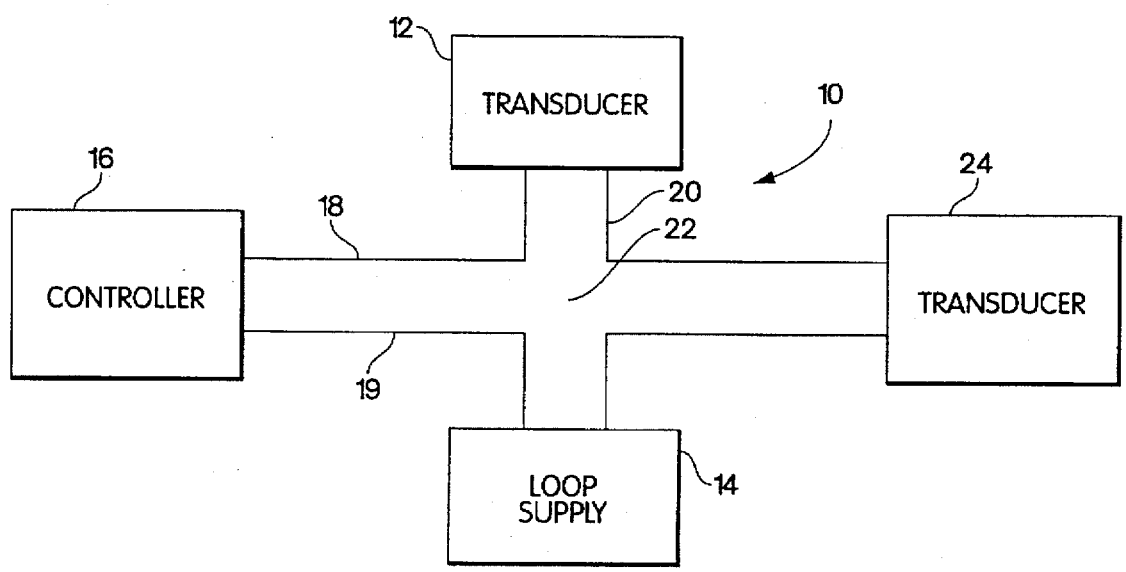
FIG. 2 is a block diagram of a conventional current control loop system having multiple transducers.
Figure 3:
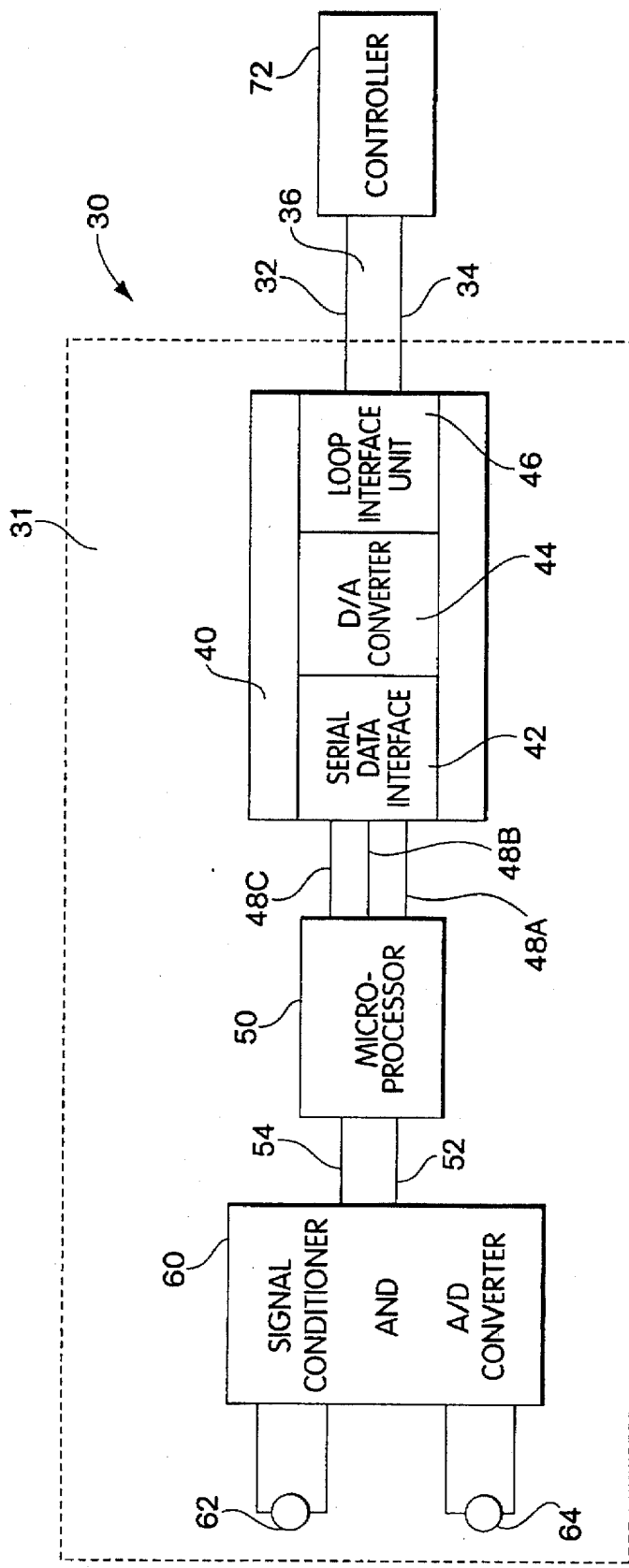
FIG. 3 is a block diagram of a conventional industrial process control system.

The system of the present invention includes a microprocessor and a data converter that communicate over a three-wire interface, as shown in FIG. 3. The system enables the microprocessor to indicate an alarm condition to the data converter, whereby a loop controller of the data converter enters an alternate mode of operation in which the current range of a current control loop is converted from a normal range of 4 to 20 milliamps to an alternate, alarm range, such as 0 to 32 milliamps.

Figure 4:
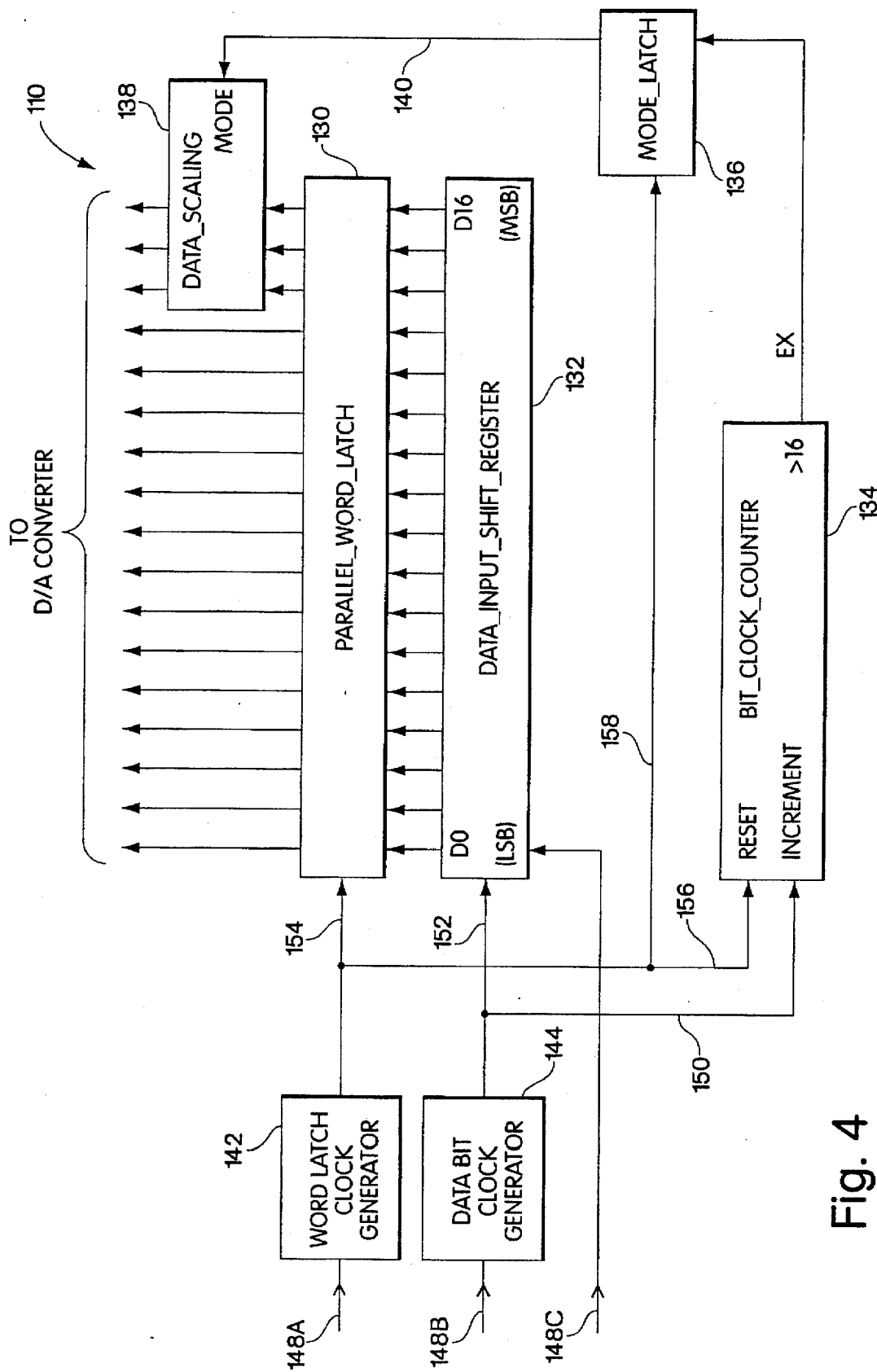
FIG. 4 is a block diagram of a serial interface unit of a data converter in accordance with one embodiment of the present invention.

In one embodiment of the present invention, a data converter is provided having a serial data interface unit with operating mode selectivity. A block diagram of a serial data interface unit 110 of a data converter in accordance with this embodiment of the invention is shown in FIG. 4. The serial data interface unit 110 includes a bit clock counter 134, a mode latch 136 coupled to the bit clock counter, and a data input shift register 132 coupled to a serial data interface bus 148C to receive serial digital data. The serial data interface unit also includes a parallel word latch 130 coupled to the data input shift register, a data scaling unit 138 coupled to the parallel word latch 130 and the mode latch 136. A data bit clock generator 144 is coupled to the data input shift register 132, the bit clock counter 134, and a data clock interface bus 148B to receive a data clock signal. A word latch clock generator 142 is coupled to the bit clock counter 134, the parallel word latch 130, the mode latch 136 and a word latch interface bus 148A to receive a primary word latch signal.

The operation of the serial data interface unit shown in FIG. 4 is described below. A microprocessor (shown in FIG. 3) generates the serial digital data, the data clock signal, and the primary word latch signal. The serial digital data is transmitted over interface bus 148C and is received in the data input shift register 132. The data clock signal is transmitted over interface bus 148B and is received by the data bit clock generator 144. The word latch signal is transmitted over interface bus 148A and is received by the word latch clock generator 142.

The data bit clock generator creates four clock signals at the same frequency as the data clock signal. The four clock signals consist of two pairs of complementary clock signals. The first pair includes a first clock signal having substantially the same phase as the data clock signal and a complementary clock signal of the first clock signal. The second pair includes a second clock signal, having the same frequency as the first clock signal but phase shifted from the first clock signal, and a complementary clock signal of the second clock signal. The four clock signals are transferred from the data bit clock generator to the bit clock counter and the data input shift register over interconnecting buses 150 and 152 respectively.

The word latch clock generator 142, similar to the data clock generator 144, creates four word latch signals at the same frequency as the primary word latch signal received from the microprocessor. The four word latch signals consist of two pairs of complementary word latch signals. The first pair includes a first word latch signal having substantially the same phase as the primary word latch signal and a complementary signal of the first word latch signal. The second pair includes a second word latch signal, having the same frequency as the first word latch signal but phase shifted from the first word latch signal, and a complementary signal of the second word latch signal. The four word latch signals are transferred from the word latch clock generator to the parallel word latch, the bit clock counter, and the mode latch over interconnecting buses 154, 156 and 158 respectively.

The data input shift register 132 uses the four clock signals, generated by the data bit clock generator, to clock the input serial data into the data input shift register. The data input shift register transfers the input serial data to the parallel word latch 130. The parallel word latch 130 transmits a parallel word to a digital-to-analog converter of the data converter upon receipt of a word latch command from the word latch clock generator indicating that a complete word has been received by the serial data interface unit.

The bit clock counter 134 is incremented by one bit for each clock cycle of the data clock signal. The bit clock counter 134 is re-set upon receipt of the word latch command from the word latch clock generator 142.

In the embodiment of the present invention shown in FIG. 4, an operational mode of the data converter is determined based upon the length of the serial data word received from the microprocessor as follows. The bit clock counter 134 enables control line EX when a count of the bit clock counter between word latch commands exceeds 16 bits. The mode latch 136 is enabled by the word latch command and detects when the control line EX has been enabled and sends a mode signal over mode control line 140 to the data scaling unit 138 based on the state of the EX control line.

The data scaling unit 138 provides an indication to the digital-to-analog converter of the appropriate scaling factors to use for converting the digital data to analog data. When the mode signal indicates that the serial data word is equal to or less than 16 bits, the data scaling unit appropriately selects the 4 to 20 milliamp range for the current control loop. When the mode latch indicates that the serial data word is in excess of 16 bits, the data scaling unit selects the 0 to 32 milliamp range for the current control loop.

Figure 5:
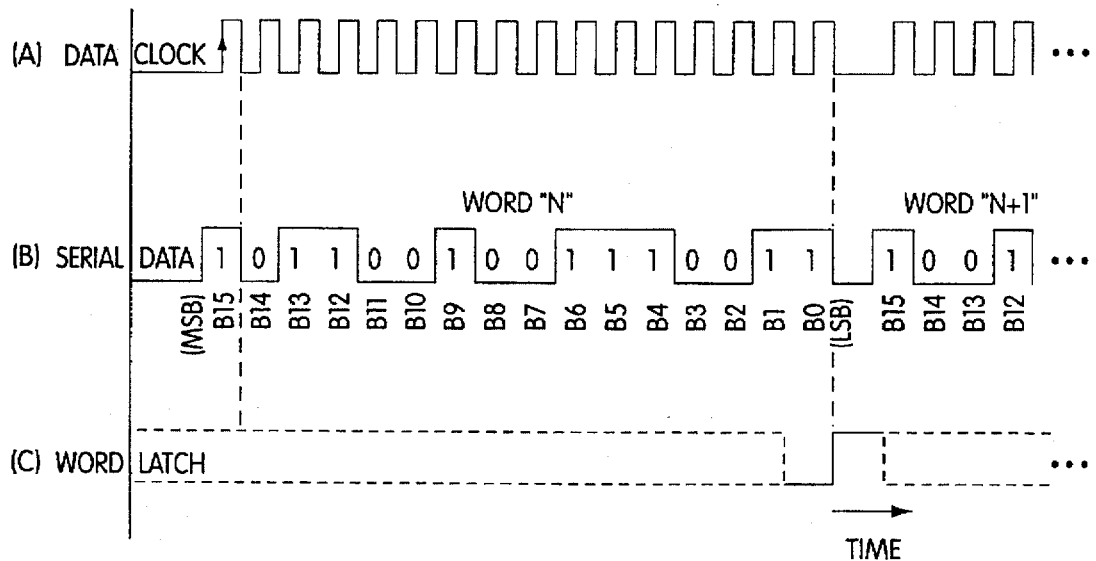
FIG. 5 is a timing diagram showing the timing relationship of input signals of a data converter in a first mode of operation in accordance with the present invention.
Figure 6:
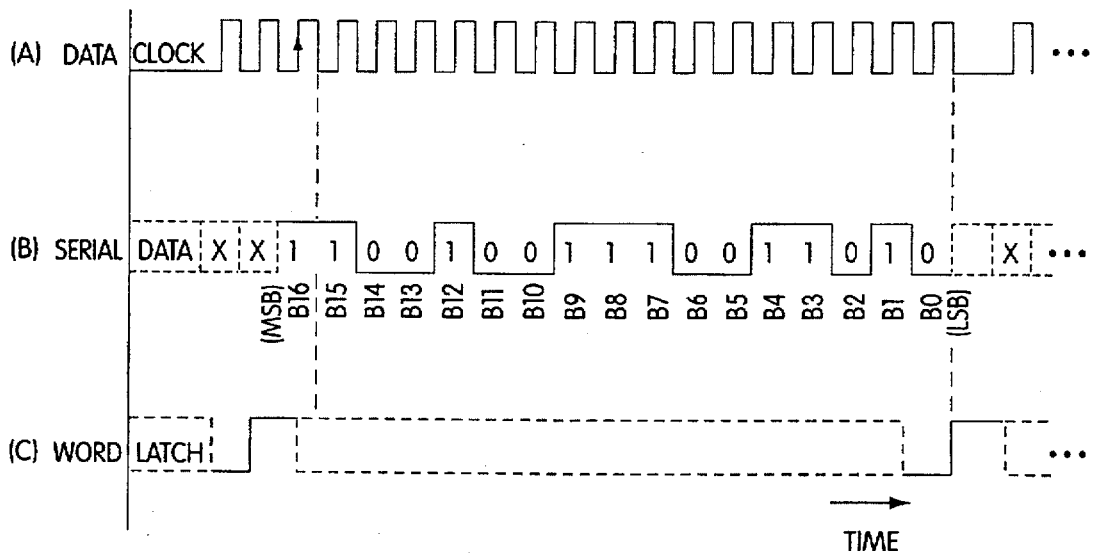
FIG. 6 is a timing diagram showing the timing relationship of input signals of a data converter in a second mode of operation in accordance with the present invention.

FIGS. 5 and 6 provide timing diagrams of the interface signals respectively received on buses 148A, 148B, and 148C in the 16 bit mode of operation of the serial interface unit and the 17 bit mode of operation of the serial interface unit respectively. FIG. 5 shows the timing relationships between the data clock signal (A), the serial data signal (B) and the primary word latch signal (C) for the 16 bit case. As shown in FIG. 5, the primary word latch signal (C) transitions from a low state to a high state after the transmission of the 16th bit of the serial data to indicate to the data converter that the word length is 16 bits and the 4 to 20 milliamp mode of operation is to be selected. The microprocessor 50 selects the 16-bit case in the absence of an alarm condition.

FIG. 6 shows the data clock signal (A), the serial data signal (B), and the primary word latch signal (C) for the operational mode in which the serial data word contains 17 bits. As shown in FIG. 6, the primary word latch signal (C) transitions from a low state to a high state after the transmission of the 17th bit of serial data to indicate to the data converter that the word length is greater than 16 bits and the 0 to 32 milliamp mode of operation is to be selected. The microprocessor 50 selects the 17-bit case to signal when an alarm condition is present.

Figure 7:
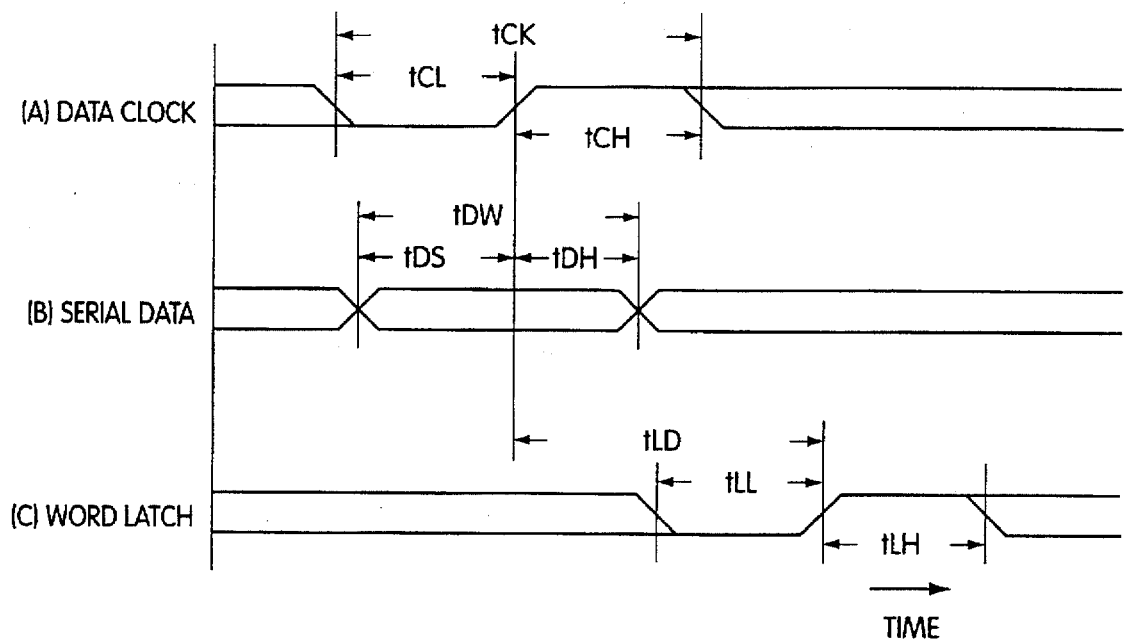
FIG. 7 is a timing diagram showing the timing relationship of input signals of a data converter in the present invention.

FIG. 7 shows, in greater resolution than FIGS. 5 and 6, the data clock signal (A), serial data signal (B), and word latch signal (C) during the transmission of the last bit of the serial data word for both the 16-bit and 17-bit cases. As shown in FIG. 7, the data clock signal switches from a low state to a high state at a period of time, denoted as tDS, after the start of the last bit of the serial data. The serial data signal remains at the logic level representing the data for a period of time, denoted as tDH, after the clock signal transitions to the high state to ensure that the serial data interface unit receives the correct logic state for the bit. The word latch signal transitions from a low state to a high state, indicating that a complete serial data word has been transmitted, at a period of time, denoted as tLD, after the occurrence of the rising edge of the data clock signal for the final bit of serial data for the word.

Table 1 contains examples of input digital words to the data converter and the corresponding output current in the current control loop for one embodiment of the present invention. In this embodiment, the output current range in the first mode of operation is 4 to 20 milliamps and the output current range in the second mode of operation is 0 to 32 milliamps. The actual output current developed in the second mode of operation in this embodiment is in fact 3.5 to 24 milliamps, even though the digital range represents from 0 to 32 milliamps, to prevent upset of a sigma-delta modulator contained within the digital-to-analog converter.

TABLE 1

| Mode | | Input Word | | | | Output Current |
|---|---|---|---|---|---|---|
| 16-bit | | 0000 | 0000 | 0000 | 0000 | 4.00 mA |
| | | 0100 | 0000 | 0000 | 0000 | 8.00 mA |
| | | 1000 | 0000 | 0000 | 0000 | 12.00 mA |
| | | 1100 | 0000 | 0000 | 0000 | 16.00 mA |
| | | 1111 | 1111 | 1111 | 1111 | ~20.00 mA |
| 17-bit | 0 | 0011 | 1100 | 0000 | 0000 | 3.75 mA |
| | 0 | 0100 | 0000 | 0000 | 0000 | 4.00 mA |
| | 0 | 1000 | 0000 | 0000 | 0000 | 8.00 mA |
| | 1 | 0000 | 0000 | 0000 | 0000 | 16.00 mA |
| | 1 | 0100 | 0000 | 0000 | 0000 | 20.00 mA |
| | 1 | 0110 | 0000 | 0000 | 0000 | 22.00 mA |

The microprocessor 50 is programmed to detect that an alarm condition is present based on data received from sensors 34 and 36 and to set the serial data output word length to 16 bits when an alarm condition is not present and to 17 bits when an alarm condition is present.

Figure 8:
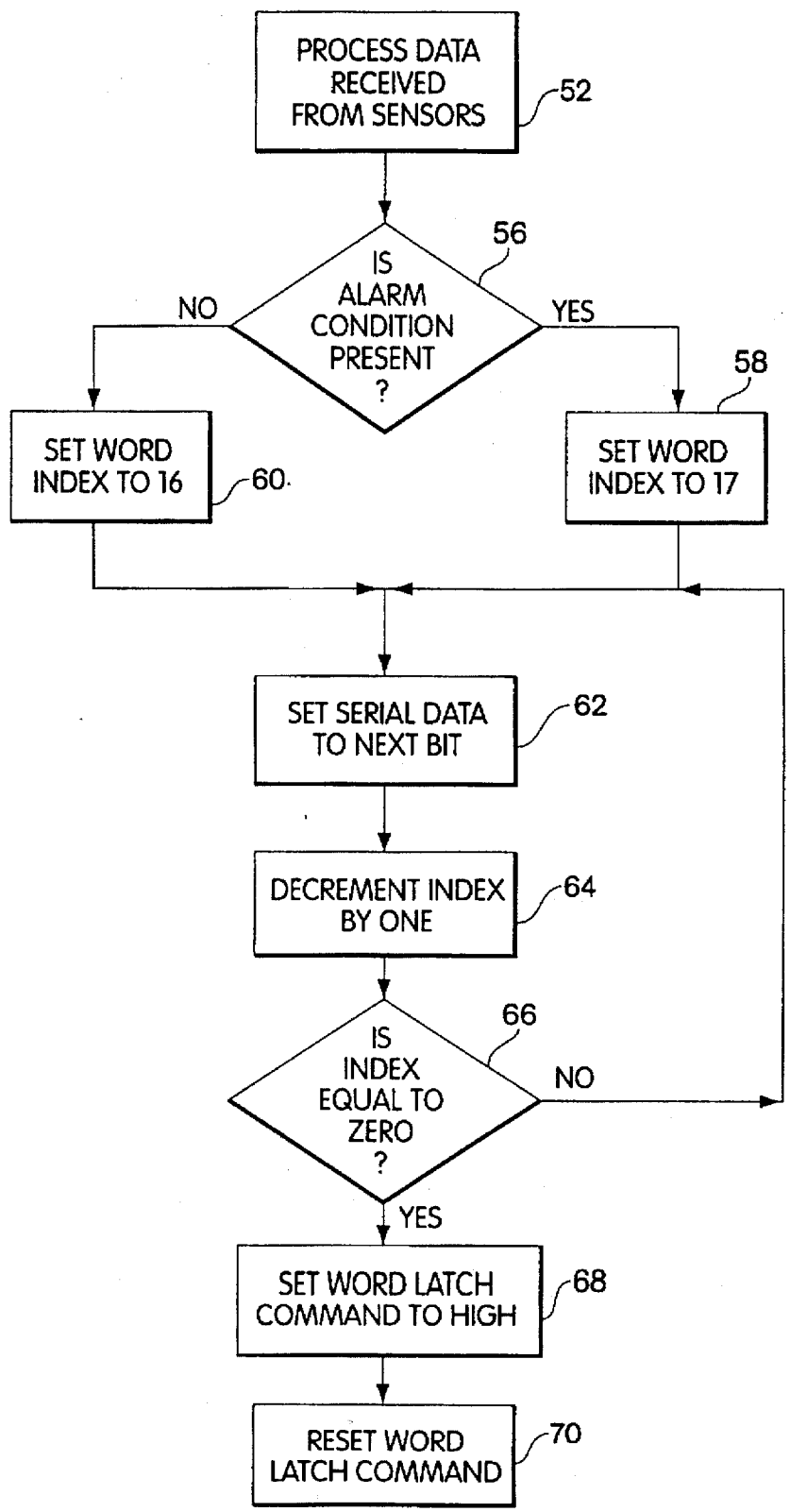
FIG. 8 is a flow chart of a process used by a microprocessor in accordance with the present invention.

The microprocessor 50 may be one of a number of commercially available microprocessors including those within the Motorola™ 68HC11 family of microprocessors, or those within the Intel™ 80C51 family of microprocessors. The microprocessor is programmed to implement the functions of the flow chart of FIG. 8. As shown in FIG. 8, the microprocessor, in step 52, processes the data received from the sensors and prepares serial output data based on the data received from the sensors. Then in step 56, the microprocessor determines whether an alarm condition is present. If an alarm condition is present, the microprocessor, in step 58, sets a word index to 17. If an alarm condition is not present, then the microprocessor, in step 60 sets the word index to 16. The microprocessor, in step 62, then sends the next bit of serial data over the serial interface. The word index then is decremented by 1 in step 64.

In step 66, a determination is made by the microprocessor whether the word index equals zero. If the word index is not equal to zero, then the next serial data bit is transmitted by the microprocessor to the data converter. If the word index is equal to zero, then in step 68, the word latch signal is set to high for a predetermined length of time. The word latch signal then is reset in step 70, and the microprocessor repeats this process for the next data word.

In the manner described above, the microprocessor utilizes a word length of the serial data words transmitted from the microprocessor to the data converter to indicate to the data converter that an alarm condition is present so that an alternate mode of operation is used in the data converter.

In one embodiment of the present invention, the microprocessor and the data converter may be incorporated in one process control module. The process control module receives sensor inputs containing data related to a process and provides control signals for a current control loop to control the process.

In the embodiments of the invention described above, the data word length for selecting a first mode of operation of the data converter has been described as being equal to or less than 16 bits, and a data word length for selecting a second mode of operation has been described as being equal to or greater than 17 bits. It should be understood that the present invention is not limited to word lengths of 16 or 17 bits. Rather, any combination of word lengths can be used to select any different number of operational modes of the data converter. In another embodiment of the present invention, for example, the number of bits for selecting a first mode of operation is 16 bits, and the number of bits for selecting a second mode of operation is 24 bits. This alternate embodiment allows transferring words having a multiple of eight bits, a common word length in digital signal processing. In this embodiment, two eight-bit bytes are used to indicate a first mode of operation, and three eight-bit bytes are used to indicate a second mode of operation. Also, in the embodiments of the invention described above, a current range for an alarm condition has been described as 0 to 32 milliamps. Other current ranges may used for an alarm condition.

In the embodiments of the invention described above, the data converter has been described as having a current control loop interface unit. It should be understood that the data converter of embodiments of the present invention may be used in different applications other than in industrial process-control systems using current control loops. The inventive concept is directed to controlling a mode of operation of a data receiver based on a number of bits in a digital word, and the concept is not limited to process control systems.

Having thus described illustrative embodiments of the invention, there are alterations, modifications and improvements that would readily occur to those skilled in the art. Such alterations, modifications and improvements are intended to be within the scope and spirit of the invention. Accordingly, the foregoing description is by way of example only and not intended as limiting. The invention is limited only as defined in the following claims and the equivalents thereto.

What is claimed is:

1. A data converter for receiving serial data words having a variable number of bits, the data converter comprising:
    a bit counter that receives the serial data words having a variable number of bits, and for each word counts the number of bits in the word and generates a word length signal corresponding to the number of bits in the word; and
    a mode selector, coupled to the bit counter, that receives the word length signal and selects an operational mode of the data converter based on the number of bits in the word.

2. The data converter of claim 1, wherein the data converter further includes a clock input that receives a data clock signal, and wherein the bit counter counts clock cycles of the data clock signal to determine the number of bits in the word.

3. The data converter of claim 1, wherein the data converter further includes a word latch input that receives a word latch signal indicating that a last bit of a word was received by the data converter.

4. The data converter of claim 1, wherein the mode selector selects a first mode of operation of the data converter for a word length of a first number of bits and a second mode of operation of the data converter for a word length of a second number of bits.

5. The data converter of claim 1, further comprising a digital-to-analog converter, coupled to the mode selector, that converts the serial data words from digital data to analog data.

6. The data converter of claim 5, further comprising a current control loop interface, coupled to a digital-to-analog converter, that provides analog signals in proper format for transmission over a current control loop.

7. The data converter of claim 6, wherein the current control loop interface provides analog signals having a first current range for a first mode of operation of the data converter, and wherein the current control loop interface provides analog signals having a second current range for a second mode of operation of the data converter.

8. A method of selecting a mode of operation of a data converter that receives serial data words having a variable number of bits, the method comprising steps of:
    for each word received, counting the number of bits in the word; and
    selecting a mode of operation of the data converter based on the number of bits in the word.

9. The method of claim 8, wherein the step of selecting includes steps of:
    selecting a first mode of operation when the word has a first range of a number of bits; and
    selecting a second mode of operation when the word has a second range of a number of bits.

10. The method of claim 8, wherein the step of selecting includes selecting a current range of a current control loop, coupled to the data converter, based on the number of bits in the word.

11. A method of selecting a mode of operation of a data converter using a data transmitter that transmits serial data words having a variable number of bits to the data converter, the method comprising steps of:
    determining a mode of operation of the data converter;
    setting the number of bits in the serial data words to a first value for a first mode of operation of the data converter; and
    setting the number of bits in the serial data words to a second value for a second mode of operation of the data converter.

12. A microprocessor for processing received data and transmitting serial data to a data converter, the microprocessor comprising:
    a processing unit that processes the received data; and
    means for setting a number of bits of a word of the serial data to a first value for a first mode of operation of the data converter and to a second value for a second mode of operation of the data converter.

13. A process control module for receiving an input signal and providing an output signal in response to the input signal, the process control module comprising:
    a microprocessor that receives and processes the input signal and provides, at an output, a serial signal having a number of bits in a word; and a data converter that receives the serial signal, the data converter including:
- a bit counter that counts the number of bits in the word received by the data converter, and generates a word length signal corresponding to the number of bits in the word, and
- a mode selector, coupled to the output of the bit counter, that receives the word length signal and selects an operational mode of the data converter based on the word length signal.

14. The process control module of claim 13, wherein the data converter further includes a clock input that receives a data clock signal from the microprocessor, and wherein the bit counter counts clock cycles of the data clock signal to determine the number of bits in the word.

15. The process control module of claim 13, wherein the data converter further includes a word latch input that receives a word latch signal from the microprocessor indicating that an end of the word is received by the data converter.

16. The process control module of claim 13, wherein the mode selector selects a first mode of operation of the data converter for a word length of a first range of a number of bits and a second mode of operation of the data converter for a word length of a second range of a number of bits.

17. The process control module of claim 13, further comprising a digital-to-analog converter, coupled to the mode selector, that converts the serial data words from digital signals to analog signals.

18. The process control module of claim 17, further comprising a current control loop interface, coupled to a digital-to-analog converter, that provides analog signals in proper format for transmission over a current control loop.

19. The process control module of claim 18, wherein the current control loop interface provides analog signals having a first current range for a first mode of operation of the data converter, and wherein the current control loop interface provides analog signals having a second current range for a second mode of operation of the data converter.

* * * * *